United States Patent [19]
Morris et al.

[11] Patent Number: 5,911,118
[45] Date of Patent: Jun. 8, 1999

[54] SCANNER WITH AUDIBLE IDENTIFICATION OF TUNED CHANNEL

[76] Inventors: Jeffrey S Morris, 762 East St., Dedham, Mass. 02026-5023; Sheldon B Michaels, 21 Stonebrook Rd., Sudbury, Mass. 01776-2735; Mark J Giubardo, 9 Wheeler St., Pepperell, Mass. 01463-1002

[21] Appl. No.: 08/818,151

[22] Filed: Mar. 14, 1997

[51] Int. Cl.$^6$ .................................................. H04B 1/18
[52] U.S. Cl. .................................... 455/156.1; 455/158.1; 455/161.2
[58] Field of Search ............................ 455/154.1, 154.2, 455/156.1, 157.1, 158.1, 158.2, 158.3, 158.4, 158.5, 161.1, 161.2

[56] References Cited

U.S. PATENT DOCUMENTS

| | | |
|---|---|---|
| 3,755,794 | 8/1973 | Stapleford . |
| 4,016,540 | 4/1977 | Hyatt . |
| 4,476,570 | 10/1984 | Ootsuka . |
| 4,563,770 | 1/1986 | Lemelson et al. . |
| 4,700,377 | 10/1987 | Yasuda et al. . |
| 4,884,059 | 11/1989 | Shapiro . |
| 4,949,274 | 8/1990 | Hollander et al. . |
| 5,095,503 | 3/1992 | Kowalski . |
| 5,152,012 | 9/1992 | Schwob ................................ 455/158.5 |
| 5,239,700 | 8/1993 | Guenther et al. ..................... 455/158.4 |
| 5,345,538 | 9/1994 | Narayannan et al. . |

*Primary Examiner*—Wellington Chin
*Assistant Examiner*—Philip J. Sobutka

[57] ABSTRACT

A scanning receiver channel identification apparatus and method comprising a scanning receiver, means for generating annunciations to be associated with the channels to which the scanning receiver is tuned, means for associating annunciations with the channels to which the scanning receiver is tuned, and means for incorporating the annunciations into the detected output of the scanning receiver for the purpose of overcoming the limitations imposed by conventional alphanumeric displays of the channel to which the receiver is tuned.

6 Claims, 3 Drawing Sheets

FIG. 5

SCANNER WITH AUDIBLE IDENTIFICATION OF TUNED CHANNEL

FIELD OF THE INVENTION

This invention relates to electronic equipment with voice annunciation and, more particularly, to radio scanners with voice or other audible identification of the tuned channel.

BACKGROUND OF THE INVENTION

Radio scanners have become an important tool in a wide range of applications from police, fire and rescue operations to hobby and sports recreation.

Generally, a set of receiving frequencies, referred to as channels, can be entered into the scanner that will be periodically monitored for transmission signals according to some predefined automatic algorithm. When a signal of sufficient strength is found in a channel, the scanner "locks" onto that channel to permit the user to hear or record the content of the signal in the channel. That is, the scanner stays tuned to the active channel for some period of time and does not immediately move on to examine another channel of the specified set. Depending upon the available options, the scanner may remain tuned to the channel indefinitely, or it may dwell on the channel only for a fixed period of time and then resume scanning of the set of channels, even though the transmission in the channel has not terminated. If there is no transmission of sufficient amplitude in a channel when it is examined, the scanner simply moves on to examine other channels in the specified set for activity.

In many applications, it is important, or even vital, for the user to have immediate knowledge of the channel to which the scanner is currently tuned. For example, in police, fire and rescue work, different agencies utilize different frequencies, or channels, for their operations. Immediate knowledge of the channel over which a transmission is heard can be essential in emergency decision making because of the equivalency of the received channel number and the source of the information conveyed.

Another example is provided by sports car racing. Pit crews, drivers, mechanics, etc. all use radio transmissions to communicate. Given the number of cars at a race and the number of participants who must all communicate, it is possible that upwards of hundreds of frequencies may be in use. To ensure that race participants will be able to communicate without mutual interference, frequencies are assigned and published prior to the event. Monitoring of these frequencies by spectators using scanners has become a significant source of relevant information for spectators following the progress of a race. Here, as in emergency work, proper interpretation of the significance of a transmission depends critically upon knowledge of the channel over which a transmission is heard because of the association of the assigned channels with specific race participants.

As important as the channel number is, in both of these examples, there is generally a high degree of activity that leaves little, or no, free time to determine the channel over which a transmission is heard.

Scanners known in the prior art employ LCD (Liquid Crystal Display) or LED (Light Emitting Diode) visual character displays to indicate the frequency, or corresponding channel number, to which the scanner is currently tuned. These devices suffer from the serious disadvantage in periods of high activity that they require the user to focus his or her attention on the visual display in order to determine the channel number. Consequently, the user is distracted from other important activities. Since, in circumstances of high activity, transmissions may be received in rapid succession over many different channels in no predictable order, the user's attention potentially can be dominated by the task of ascertaining the channel, and hence source, of transmissions. On the other hand, failure to pay close attention to the channel number may result in misunderstanding and improper decision making with serious consequences.

Accordingly, it would be desirable if the scanner channel number could be conveyed by a voice or other audible identification, thereby freeing the user's attention for other tasks. Even more desirable would be audible annunciation of more immediately meaningful information correlated with the channel number. That is, rather than, or in addition to, simple identification of the channel number, it would be desirable if the scanner could provide other audible information such as the name of the emergency unit or the race car driver assigned to the channel.

Since the relationship between the channel number and the assignee to the channel, or other information, is likely to change over time, it would also be desirable that means be provided for the user to enter and change custom annunciations associated with each scanner channel. And, because the number of channels that must be set could be quite large, it would also be desirable that means be provided for uploading and downloading whole sets of channel frequencies and associated annunciations thereby freeing the user of the tedium, and possible error, associated with manual entry.

SUMMARY OF THE INVENTION

This invention is a method and apparatus for providing automatic audible voice or other identification of the channel to which a scanning receiver is currently tuned, or, alternatively or in addition, of providing other automatic audible information correlated with the channel to which the scanning receiver is currently tuned. Annunciation of receiver channel number, or other alternative information, is, in a preferred embodiment, through the audio output means already provided with the receiver, but could as well be directed, using either analog or digital means, to a wide range of other means such as auxiliary receivers, audio equipment, microprocessors, computers or recording equipment. Likewise, a wide range of methods well known to those skilled in the art, such as direct wire, radio link or fiber optic, can be used to route annunciations to auxiliary devices. All such variations are considered to fall within the scope of the current invention.

Several embodiments of the invention are here contemplated with the choice of which is to be preferred depending upon the demands of the application. More particularly, the annunciation may occur at the beginning or the termination of the transmission within the channel to which the receiver is tuned. Likewise, the annunciation may preempt, may be heard simultaneously with or may delay concurrent transmissions in the channel. The annunciation itself may consist of analog or digitally synthesized speech, analog or digitally recorded speech or any other form of information or representation. The content of the annunciation may be wholly predefined, selected from a predefined set, or entirely arbitrary. An embodiment of the present invention may incorporate any or all of the foregoing in any combination as deemed to meet the demands of the application and other constraints such as cost. All such variations are considered to fall within the scope of the current invention. Elucidation of these alternatives follows in the subsequent discussion.

It is an objective of the present invention, through combinations of the implementation alternatives outlined above, to enable users of scanning receivers to identify more readily the sources of transmissions with the intent of enhancing comprehension and improving decision making.

More particularly, it is an objective of the present invention to provide a new and improved apparatus and method for identification of the channel to which a scanning receiver is currently tuned.

It is likewise another objective of the present invention to provide a new and improved apparatus and method for providing other useful or meaningful information correlated with the channel to which a scanning receiver is currently tuned.

It is yet another objective of the present invention to provide a new and improved apparatus and method for specifying the content of the annunciation, which correlates with the channel to which a scanning receiver is currently tuned.

SPECIAL FUNCTIONS USED IN FIGURES

Throughout the following discussion, like numerical designations in the several figures refer to like functional blocks or elements of the invention in the illustrated embodiments. Their meanings and characteristics are presented here, prior to the detailed description of the representative embodiments of the invention, in order to facilitate those subsequent descriptions. Specific reference is now made to FIGS. 1 through 6.

Input Signals

In the figures, item 10, labelled RCVR AUDIO, represents the audio, or other detected signal, that is ordinarily produced by the scanning receiver. In the representative embodiments, this is assumed to be a low level signal preceding the amplification and output stages 20 and 21, whose descriptions are given more fully below, but any like signal produced or derived from the scanning receiver may be used. Likewise, special circuitry, employing techniques well know to those skilled in the art, may be added to or incorporated into the receiver to provide the signal 10. All such alternatives are considered to fall within the scope of the current invention.

Item 11 represents a signal, or set of signals, generated within the scanning receiver that encode the channel to which the receiver is currently tuned. Typically, this would be a set of lines whose logical levels encode the channel number in binary notation. However, an essentially limitless variety of alternative methods known in the art may be employed. For example, the channel number may be encoded as the binary representation of the channel frequency in suitable units, rather than the channel number. Or, the channel may be encoded by the level of a voltage such as, for example, that used to set a voltage controlled local oscillator. Item 11 is to be understood in the most general sense to be any convenient representation, encoding or other parameter or function generated within the scanning receiver from which the current channel can be deduced.

Likewise, all functional blocks or elements of the invention shown in the several embodiments that accept the CHNL NO. 11 as an input are understood to be capable of deducing the current channel number, or corresponding information, from 11 by appropriate means, which are well known and obvious to those skilled in the art.

Item 12 in the figures denotes a suitable signal or level generated within the scanning receiver that indicates that a transmission is being received in the channel to which the receiver is currently tuned. Typically, this could be derived from the AGC (automatic gain control), limiter or squelch circuitry of the receiver. However, like the CHNL NO. 11, the CHNL ACTIVE signal 12 can be derived using an essentially limitless number of methods and techniques well known to those skilled in the art.

For the sake of the discussion, the CHNL ACTIVE signal 12 is assumed to be a level that is high when a transmission is being received in the channel and low when it is not. However, in practice, the actual method of encoding the state of activity in the channel 12 is up to the designer using any of a wide range of methods well known in the art. All functional blocks or elements of the invention shown in the several embodiments that accept the CHNL ACTIVE signal 12 as an input are understood to be capable of detecting, by appropriate means, channel activity from 12, whether it is represented by a level or an alternative method known to those skilled in the art.

In the representative embodiments, items 11 and 12 are assumed to be derived from signals ordinarily found within the scanning receiver. However, special circuitry, employing techniques well know to those skilled in the art, may be added to or incorporated into the receiver to provide either, or both, of 11 and 12. All such alternatives are considered as well to fall within the scope of the current invention.

Channel Latch

Figure 1:
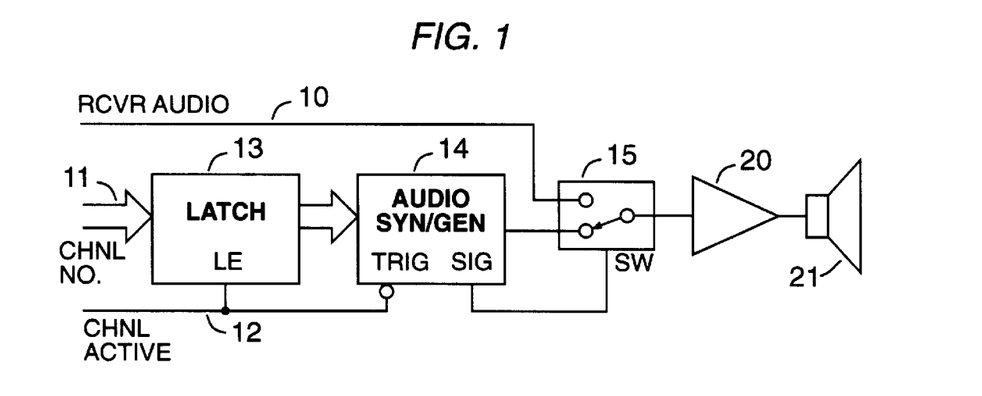
FIG. 1. Implementation in which the annunciation is appended to the transmission in the channel and preempts the receiver audio output.
Figure 2:
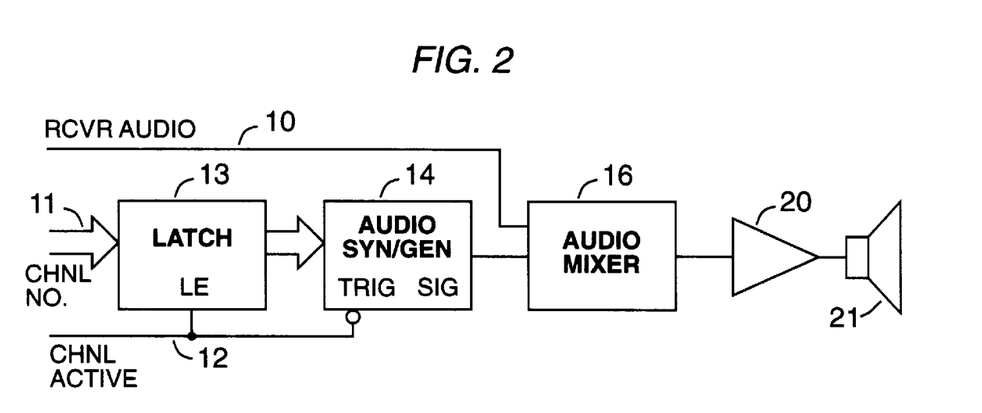
FIG. 2. Implementation in which the annunciation is appended to the transmission in the channel and is heard simultaneously with the receiver audio output.
Figure 3:
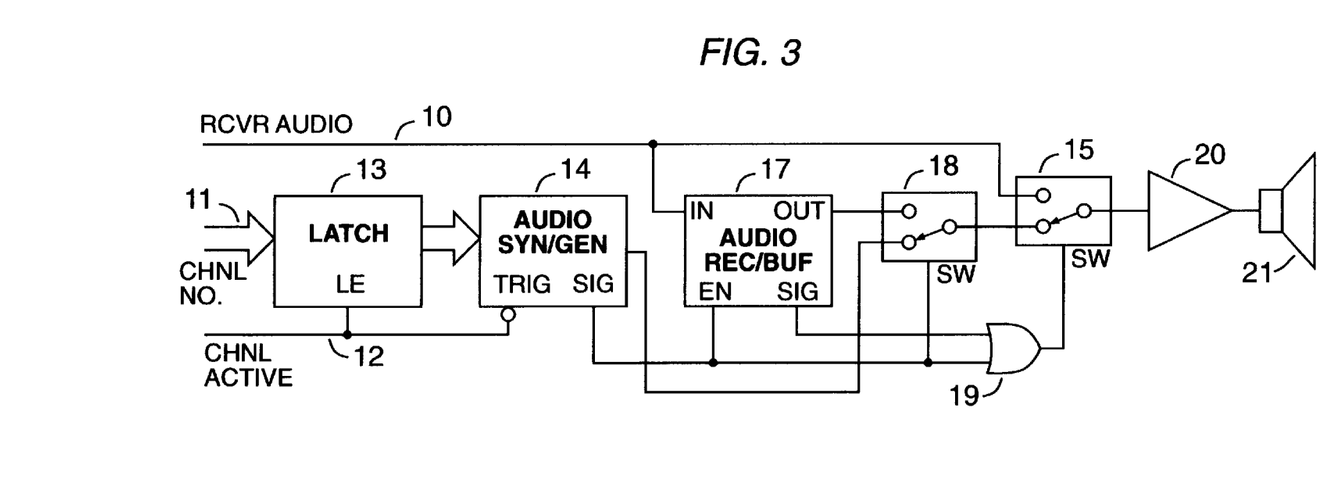
FIG. 3. Implementation in which the annunciation is appended to the transmission in the channel and delays receiver audio that occurs simultaneously with the annunciation.

Item 13, labelled LATCH, which appears in FIGS. 1, 2 and 3, is a latch having the following properties. When the LE input to 13 goes high, the value of the current channel is transferred to and latched into the output of 13 until the next time that the LE input goes high. In particular, the output of 13 remains latched when the LE input subsequently goes low.

Comporting with the generality of the representation of the CHNL NO. 11 discussed above, both the input and the output of the LATCH 13 may take any of an essentially limitless variety of forms well known the those skilled in the art. Moreover, it is not necessary that the input and output of 13 be of the same form. For example, the CHNL NO. 11 input to LATCH 13 could be a voltage level corresponding to the current channel, whereas the output from 13 could be a digital representation of the channel number, or other parameter related to the channel number such as frequency.

Accordingly, other than the obvious requirement that any functional block or element of the invention that accepts the output of LATCH 13 as input must be capable of deducing the requisite information from that input, the output of LATCH 13 is to be understood in the most general sense.

Generation of Annunciation

Figure 4:
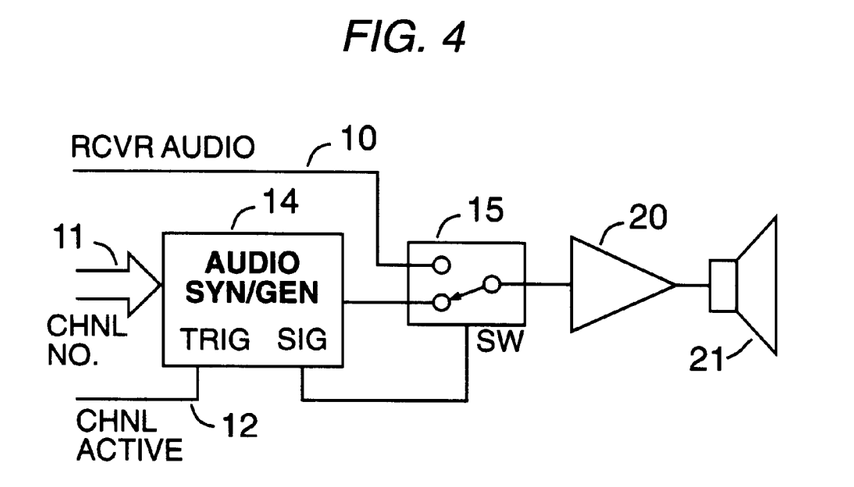
FIG. 4. Implementation in which the annunciation occurs at the beginning of the transmission in the channel and preempts the receiver audio output.
Figure 5:
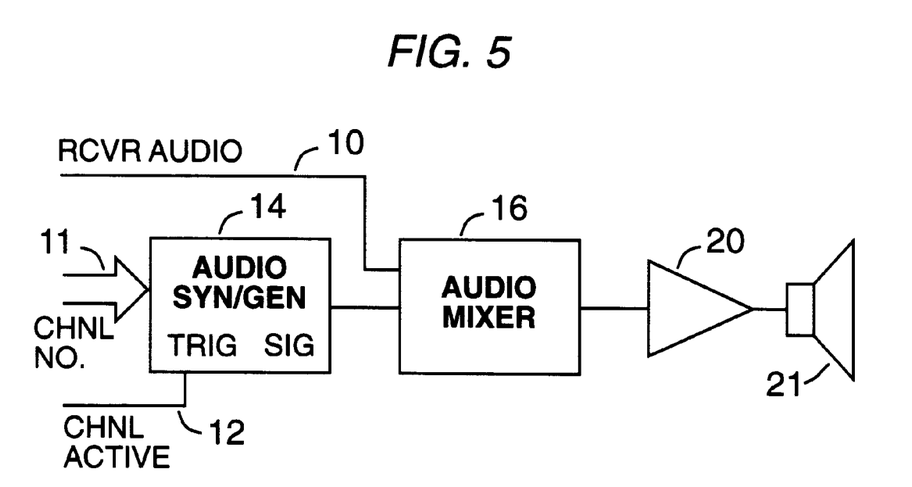
FIG. 5. Implementation in which the annunciation occurs at the beginning of the transmission in the channel and is heard simultaneously with the receiver audio output.
Figure 6:
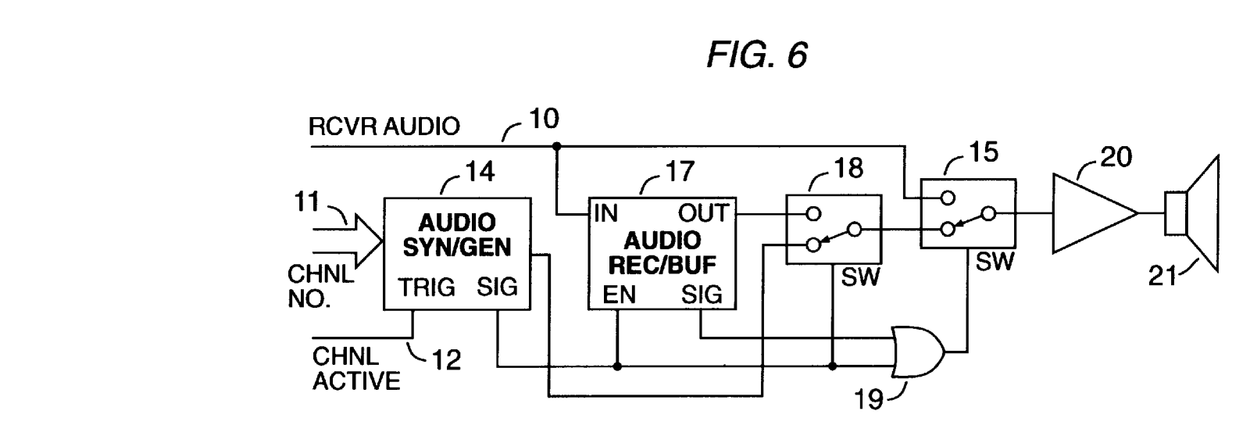
FIG. 6. Implementation in which the annunciation occurs at the beginning of the transmission in the channel and delays receiver audio that occurs simultaneously with the annunciation.

Item 14, labelled AUDIO SYN/GEN, which appears in FIGS. 1 through 6, is a functional block that is capable of generating an audio output signal in response to its inputs, which output may be human speech or any other meaningful signal. More particularly, audio output is generated by 14 corresponding to and representing the information contained in its left hand input in response to the positive-going transition of the input labelled TRIG. In FIGS. 1 through 3, the left hand input is the latched channel number output from 13. In FIGS. 4 through 6, the left hand input is the CHNL NO. 11 generated within the scanning receiver.

The output of 14 labelled SIG is a level that is maintained high by 14 for the duration of the time that the audio signal is being output by 14. Otherwise, when 14 is not outputting audio, SIG is maintained low. The choice of this convention for representing the activity of 14 is for convenience in the discussion. Any other convenient representation may as well be adopted by the designer using methods well known to those skilled in the art. All such representations are considered to fall within the scope of the current invention.

While, in a preferred embodiment, 14 would generate human speech signals, 14 should be understood in the most general sense to be capable of generating any signal, or signals, meaningful to the user of the receiver that are to be correlated with the current channel to which the receiver is tuned. For example, in a particular instance, the signal generated by 14 might be a Morse code representation, rather than a speech representation, of the channel number. Furthermore, 14 may be capable of generating more than one form of audio output signal as conditioned by user input (not shown). For example, 14 may be implemented to produce either a speech or a Morse code representation under selection by the user. All such multiple output options and capabilities are considered to fall within the scope of the current invention.

A wide variety of methods known in the art may be employed by 14 to generate an audio output signal in response to its inputs. All such methods are understood to fall within the scope of the invention. For example, the audio output from 14 may be generated from an internally stored analog or digital recording or by analog or digital synthesis.

Item 14 may contain other inputs as required by specific applications, which inputs are not shown, but which employ methods well known to those skilled in the art. For example, in an implementation in which the user can record annunciations to be associated with specific channels, 14 would necessarily contain provisions for inputting and recording the user's speech. Or, in an implementation in which the user selects annunciations for a predefined internally stored set, 14 might employ a keypad for registering such selections. Such additional inputs to 14 could also come from a functionally distinct block, or blocks, attached or coupled to 14. The incorporation of all such additional inputs, or distinct block, or blocks, for this purpose are considered to fall within the scope of the current invention.

Record/Playback Function

Item 17, labelled AUDIO REC/BUF, which appears in FIGS. 3 and 6, is an audio recording and playback function having the following properties. Item 17 records the audio signal presented to its input labelled IN. Recording begins when the level at its input labelled EN undergoes a transition to high. When the level at EN subsequently returns to low, the audio signal that has been recorded by 17 to that moment begins to be output from 17 through OUT in time-compressed form. Recording and delayed playback through OUT of recorded audio in time-compressed form continue until the content of the played back time-compressed recorded audio through OUT and the current real time audio appearing at IN are in register.

Registration of the compressed and real time audio content occurs at a time determined as follows. Let t=0 be the time at which recording is initiated by 17 in response to the positive-going transition at the input EN. Let $t_A$ be the time at which the level at EN subsequently returns to low and playback begins. Let $\rho$ be the audio time compression factor, where $0<\rho<1$. That is, t seconds of recorded audio will be played back through OUT in $\rho t<t$ seconds due to the effect of audio time-compression. At any time $t_r$ after the initiation at t=0 of recording by 17, there will be $t_r$ seconds of recorded audio to be played back at the compressed rate. Since output of the compressed audio does not begin until $t=t_A$, there will be at time $t_r$ only $t_r-t_A$ seconds within which to have played back the compressed audio. The contents of the played back compressed audio and the real time audio presented at IN will be in register when the time required for playback, at the compressed rate, of the recorded audio and the time available for playback are equal. That is, when $\rho t_r = t_r - t_A$. Solving for $t_r$, the real time after initiation of recording by 17 at which compressed played back audio and real time audio content will be in register is $$t_r = \frac{t_A}{1-\rho}. \tag{1}$$

If the audio signal input to 17 at IN terminates at a time $t_e$ prior to $t_r$ given by (1), then $t_e$ seconds of audio must be played back. This will be accomplished in $\rho t_e$ seconds given the compression factor $\rho$. Since $t_A$ seconds elapse prior to the beginning of playback, the total compressed audio playback time in this case is $$t_r = t_A + \rho t_e \tag{2}$$

seconds.

If a constant time-compression factor $\rho$ cannot be maintained by the algorithm adopted for compression, the above formulas (1) and (2) must be modified in a manner dictated by the chosen algorithm and obvious to one skilled in the art.

Accordingly, 17 begins recording the receiver audio presented to input IN when the level at EN makes a transition to high. With the convention that t=0 at the beginning of recording, recording continues until time $t_r$ given by either (1) or (2) above, whichever is earlier. Time-compressed playback of the recorded audio through OUT of 17 commences at time $t_A$ when the level at EN makes the return transition to low, while, generally, recording continues. Also, the output level at SIG of 17 goes high at $t=t_A$ when playback through OUT begins. The level at SIG of 17 remains high for as long as time-compressed playback is being output; that is, until time $t_r$ given by (1) or (2), whichever is earlier. Thereafter, audio output from 17 ceases and the level at SIG of 17 returns to low, signifying termination of audio output from 17.

Item 17 contains means for determining the elapsed times $t_A$ and $t_e$ that enter (1) and (2). The former, that is $t_A$, can be determined from the interval during which input EN is high. The latter, that is $t_e$, must be determined from an additional input to 17 (not shown) that reflects the interval during which there is a transmission signal in the current channel. A candidate for this additional input is the CHNL ACTIVE signal 12. Given $t_A$ and $t_e$, 17 determines which of the times given by (1) and (2) is earlier and limits the duration of recording and playback of compressed audio output through OUT, and the corresponding level at SIG, accordingly.

A possible simplification of 17 is to ignore the determination of $t_e$ and, therefore, the need to compute (2) and compare the result with (1). Recording and playback simply run until time $t_r$ given by (1). In this case, if the transmission in the channel terminates before the time $t_r$, the final portion of the compressed audio played back through OUT will be, typically, random noise recorded in the channel in the absence of a transmission signal. The success of this simplification depends upon the ability to maintain the audio time-compression factor ρ during the playback of channel noise as well as during playback of a transmission signal in the channel. The embodiments illustrated in FIGS. 3 and 6 incorporate this simplification.

The recording, playback, time-compression, interval measuring, comparison, computing and other discussed internal functions incorporated within 17 can be implemented using methods and techniques well known to those skilled in the art and are, therefore, not described here in detail. A variety of techniques is available for implementing each of these internal functions. For example, recording can be in either analog or digital form. Interval measurement can be accomplished using well known analog techniques, or can be accomplished using a microprocessor and digital sampling techniques. Equation evaluation and comparison can be implemented using analog circuitry or in a programmed microprocessor. Audio time-compression can be accomplished by simple speed up of an analog magnetic recording or through analog-to-digital and digital-to-analog conversion and an intermediate dual ported memory in which the read port follows, and is advanced faster than, the write port. In such a case, the termination time for recording and playback by 17 can be determined by the coincidence of the read and write port addresses instead of formula (1). Audio time-compression can also be accomplished by other more sophisticated techniques and means, both analog and digital, well known to those skilled in the art. All such variations, including those not specifically mentioned but known in the art, are considered to fall within the scope of the current invention.

Likewise, the choice of the high-low level convention for representing the output activity of 17 at SIG is for convenience in this discussion. Any other convenient representation may as well be adopted by the designer, with appropriate and obvious downstream modifications, using methods well known to those skilled in the art. All such representations are considered to fall within the scope of the current invention.

Other Functions

Items 15 and 18 are SPDT audio signal transmission gates actuated by the level at the input labelled SW. Such transmission gates are well known in the art. As drawn, when SW is high, the respective gate, represented as a simple SPDT switch, forms a path from the lower input to the output. When SW is low, the path is formed between the upper input and the output. Any other functionally equivalent prior art method, circuit or device may be substituted for either, or both, of 15 and 18, as will be obvious those skilled in the art.

Item 16, labelled AUDIO MIXER, which appears in FIGS. 2 and 5, is a simple audio mixer, well known in the art. The audio output of 16 is a combination of the two audio inputs to 16.

Item 19 is a two-input inclusive OR gate well known in the art. It produces a high output when either one, or both, of its inputs are high. Otherwise, its output is low.

Item 20 represents the audio amplification and processing stages of the scanning receiver within which the invention is incorporated, as well as any additional devices or circuitry attached to the receiver through or into which the audio signal passes or is processed.

Item 21 represents the means by which the audio signal is ultimately rendered intelligible to the user. For example, 21 may be a loudspeaker or a set of headphones. More generally, 21 could be any other device or medium known in the art for rendering, recording or otherwise presenting, processing or displaying the audio output.

DETAILED DESCRIPTION OF THE INVENTION

With the preceding descriptions of the functional blocks and elements as a foundation, FIGS. 1 through 6 present schematic representations of six possible embodiments of the invention. As will be seen, these embodiments realize various combinations of the characteristics mentioned under Summary of the Invention above. In particular, combinations of the choices of appending the annunciation to the termination of the transmission signal in the channel or creating the annunciation at the beginning of the signal in the channel, preempting the scanning receiver audio by the annunciation, adding the annunciation to or combining it with the receiver audio, or delaying the receiver audio until the termination of the annunciation. Many other variations and combinations will be obvious to those skilled in the art and are considered to fall within the scope of the current invention. Likewise, the specific functional realizations of the invention represented schematically by FIGS. 1 through 6 can be accomplished in many other ways that will be obvious to those skilled in the art. All such realizations are considered to fall within the scope of the current invention.

Representative Embodiment No. 1

With reference to FIG. 1, the first representative embodiment of the invention produces an annunciation of, or correlated with, the channel number on the termination of the transmission in the channel to which the scanning receiver is tuned. Output of the annunciation preempts the normal receiver audio output.

On the occurrence of a transmission signal in the channel, the CHNL ACTIVE level 12 goes high. This causes CHNL NO. 11 to be latched into the output of LATCH 13. The channel number remains latched until the next time 12 goes high. When 12 goes low, following the transition to high that latches the channel number, the input TRIG to 14 goes high due to the NOT function attached to TRIG. This initiates generation of the annunciation by 14. Output SIG from 14 goes to and remains high for as long as the annunciation is being output from 14. Consequently, the audio transmission gate 15 is held in the state that conducts the annunciation output of 14 to the receiver output means 20 and 21. On termination of the output of the annunciation from 14, the level SIG returns to low, causing gate 15 to assume the opposite state in which the normal receiver audio is again routed to the output means 20 and 21.

Representative Embodiment No. 2

With reference to FIG. 2, the second representative embodiment of the invention produces an annunciation of, or correlated with, the channel number on the termination of the transmission in the channel to which the scanning receiver is tuned. In this case, output of the annunciation is combined with the normal receiver audio output.

On the occurrence of a transmission signal in the channel, the CHNL ACTIVE level 12 goes high. This causes CHNL NO. 11 to be latched into the output of LATCH 13. The channel number remains latched until the next time 12 goes high. When 12 goes low, following the transition to high that latches the channel number, the input TRIG to 14 goes high due to the NOT function attached to TRIG. This initiates generation of the annunciation by 14, which is coupled directly to AUDIO MIXER 16, causing the combined annunciation and normal receiver audio to be sent to the output means 20 and 21. Note that output SIG from 14 is not used in this embodiment of the invention.

Representative Embodiment No. 3

With reference to FIG. 3, the third representative embodiment of the invention produces an annunciation of, or correlated with, the channel number on the termination of the transmission in the channel to which the scanning receiver is tuned. Output of the annunciation delays, but does not preempt, the normal receiver audio output. Normal receiver audio that occurs concurrently with the annunciation is recorded and played back in time-compressed form immediately following the annunciation until the content of such playback has caught up with the content of the real time receiver audio.

On the occurrence of a transmission signal in the channel, the CHNL ACTIVE level 12 goes high. This causes CHNL NO. 11 to be latched into the output of latch 13. The channel number remains latched until the next time 12 goes high. When 12 goes low, following the transition to high that latches the channel number, the input TRIG to 14 goes high due to the NOT function attached to TRIG. This initiates generation of the annunciation by 14. Output SIG from 14 goes to and remains high for as long as the annunciation is being output from 14. The transition of the SIG output of 14 to high initiates recording by 17 of the normal receiver audio presented at input IN of 17. Time-compressed output of the audio recorded by 17 begins on the termination of the annunciation, as determined by the return of the SIG output of 14 to low, and appears at output OUT of 17. It continues until the content of the time-compressed audio output has caught up with the real time content of the normal receiver audio as described in detail in the section Record/Playback Function above. Output SIG of 17 goes to and remains high for as long as delayed, time-compressed audio output is present at OUT of 17. That is, output SIG of 17 is high from the first appearance of delayed, time-compressed audio at OUT until the content of the audio at OUT has caught up to the content of the real time receiver audio.

Output SIG of 14 holds audio transmission gate 18 in the state in which the audio output of 14 is routed to the tandem audio transmission gate 15 for the duration of the annunciation generated and output by 14. On termination of the annunciation, as determined by the return of the SIG output of 14 to low, gate 18 switches to the opposite state in which delayed, time-compressed audio output from 17 is routed to the tandem audio transmission gate 15. In this way, the annunciation, followed immediately by the delayed, time-compressed audio, is routed to the lower input of gate 15.

The output of OR gate 19 is high whenever the SIG output of 14 or the SIG output of 17 is high, or when both are high. Consequently, the output of OR gate 19 is continuously high throughout the generation of the annunciation by 14 and the subsequent output of delayed, time-compressed audio by 17, until the content of the output of 17 has caught up to the real time content of the receiver audio.

The high output from OR gate 19 holds audio transmission gate 15 in the state in which output from audio transmission gate 18 is routed to the output means 20 and 21. When the output from OR gate 19 goes low, gate 15 switches to the state in which normal receiver audio is routed to the output means 20 and 21. In this way, the annunciation, followed immediately by delayed, time-compressed playback of the receiver audio that has occurred in the meantime is routed to the output means 20 and 21. When the content of the delayed, time-compressed audio has caught up to the content of the real time receiver audio, the output of OR gate 19 goes low and the normal receiver audio is again routed to output means 20 and 21 by transmission gate 15. The result is that the annunciation is rendered on the termination of the transmission signal in the channel to which the receiver is tuned, followed by time-compressed playback of normal receiver audio that occurs during or subsequent to the annunciation, until such time as the content of the playback catches up to that of the normal receiver audio. Thereafter, the normal receiver audio is output to means 20 and 21.

Representative Embodiment No. 4

With reference to FIG. 4, the fourth representative embodiment of the invention produces an annunciation of, or correlated with, the channel number at the beginning of the transmission in the channel to which the scanning receiver is tuned. Output of the annunciation preempts the normal receiver audio output.

On the occurrence of a transmission signal in the channel, the CHNL ACTIVE level 12 goes high. This initiates generation of the annunciation by 14 corresponding to the CHNL NO. 11 input to 14. Output SIG from 14 goes to and remains high for as long as the annunciation is being output from 14. Consequently, the audio transmission gate 15 is held in the state that conducts the annunciation output of 14 to the receiver output means 20 and 21. On termination of the output of the annunciation from 14, the level SIG returns to low, causing gate 15 to assume the opposite state in which the normal receiver audio is again routed to the output means 20 and 21.

Representative Embodiment No. 5

With reference to FIG. 5, the fifth representative embodiment of the invention produces an annunciation of, or correlated with, the channel number at the beginning of the transmission in the channel to which the scanning receiver is tuned. In this case, output of the annunciation is combined with the normal receiver audio output.

On the occurrence of a transmission signal in the channel, the CHNL ACTIVE level 12 goes high. This initiates generation of the annunciation by 14 corresponding to the CHNL NO. 11 input to 14, which is coupled directly to AUDIO MIXER 16, causing the combined annunciation and normal receiver audio to be sent to the output means 20 and 21. Note that output SIG from 14 is not used in this embodiment of the invention.

Representative Embodiment No. 6

With reference to FIG. 6, the sixth and final representative embodiment of the invention produces an annunciation of, or correlated with, the channel number at the beginning of the transmission in the channel to which the scanning receiver is tuned. Output of the annunciation delays, but does not preempt, the normal receiver audio output. Normal receiver audio that occurs concurrently with the annunciation is recorded and played back in time-compressed form immediately following the annunciation until the content of such playback has caught up with the content of the real time receiver audio.

On the occurrence of a transmission signal in the channel, the CHNL ACTIVE level 12 goes high. This initiates generation of the annunciation by 14 corresponding to the CHNL NO. 11 input to 14. Output SIG from 14 goes to and remains high for as long as the annunciation is being output from 14. The transition of the SIG output of 14 to high initiates recording by 17 of the normal receiver audio presented at input IN of 17. Time-compressed output of the audio recorded by 17 begins on the termination of the annunciation, as determined by the return of the SIG output of 14 to low, and appears at output OUT of 17. It continues until the content of the time-compressed audio output has caught up with the real time content of the normal receiver audio as described in detail in the section Record/Playback Function above. Output SIG of 17 goes to and remains high for as long as delayed, time-compressed audio output is present at OUT of 17. That is, output SIG of 17 is high from the first appearance of delayed, time-compressed audio at OUT until the content of the audio at OUT has caught up to the content of the real time receiver audio.

Output SIG of 14 holds audio transmission gate 18 in the state in which the audio output of 14 is routed to the tandem audio transmission gate 15 for the duration of the annunciation generated and output by 14. On termination of the annunciation, as determined by the return of the SIG output of 14 to low, gate 18 switches to the opposite state in which delayed, time-compressed audio output from 17 is routed to the tandem audio transmission gate 15. In this way, the annunciation, followed immediately by the delayed, time-compressed audio, is routed to the lower input of gate 15.

The output of OR gate 19 is high whenever the SIG output of 14 or the SIG output of 17 is high, or when both are high. Consequently, the output of OR gate 19 is continuously high throughout the generation of the annunciation by 14 and the subsequent output of delayed, time-compressed audio by 17, until the content of the output of 17 has caught up to the real time content of the receiver audio.

The high output from OR gate 19 holds audio transmission gate 15 in the state in which output from audio transmission gate 18 is routed to the output means 20 and 21. When the output from OR gate 19 goes low, gate 15 switches to the state in which normal receiver audio is routed to the output means 20 and 21. In this way, the annunciation, followed immediately by delayed, time-compressed playback of the receiver audio that has occurred in the meantime is routed to the output means 20 and 21. When the content of the delayed, time-compressed audio has caught up to the content of the real time receiver audio, the output of OR gate 19 goes low and the normal receiver audio is again routed to output means 20 and 21 by transmission gate 15. The result is that the annunciation is rendered at the beginning of the transmission signal in the channel to which the receiver is tuned, followed by time-compressed playback of normal receiver audio that occurs during or subsequent to the annunciation, until such time as the content of the playback catches up to that of the normal receiver audio. Thereafter, the normal receiver audio is output to means 20 and 21.

Annunciation Function

All embodiments of the current invention incorporate means, represented by 14 in FIGS. 1 through 6, for generating the annunciation that is to be associated with each channel to which the scanning receiver is tuned when there is activity in the channel. A wide range of options exists for implementing selection of the annunciation to be associated with each channel, as well as determining the complexity of the annunciations that can be accommodated. And, because the receiver may incorporate a large number of channels and the associated annunciations may have to be changed quickly on an application-specific basis, means must be provided for setting and changing annunciations.

In the simplest case, the annunciation associated with a given channel may be predetermined and not alterable by the user of the receiver. For example, the annunciation produced by 14 may simply be an announcement of the current channel number in the form of human speech. Such an implementation has the advantage of simplicity in that no provisions need be made for altering the content of the annunciations—they are invariably the number of the currently active channel—but suffers from the disadvantage that the user must mentally associate the given channel number with the known user of the channel. Nevertheless, even this is of great utility because of the ease with which the channel number can be understood from human speech without having to divert visual attention and mental processes away from other tasks in order determine the channel number from the conventional numerical display on the receiver.

A slightly more complex system would allow the user to configure the set of annunciations from a relatively small set of predefined primitives. For example, a scanning receiver that incorporates the current invention and is intended for automobile racing spectators might contain a fixed set of primitives such as "car," "driver," "media," "track," "safety" and sufficient other primitives to be able to articulate any whole number up to some maximum value. Through, for example, a keypad, the user could then set up annunciations, to be associated with each channel, such as "car ten," "safety three," etc.

A yet more complex system would allow the user to record a set of very brief custom primitives to be used in the manner of the previous example. For example, the user might record primitives such as "car," "driver," "media," "track," "safety," etc. for use at an automobile race whereas the primitives "hospital," "police," "fire," "EMT," etc. might be recorded instead for use in emergency medical service. This system offers the obvious advantage that the same receiver could be used for a variety of applications rather than the receiver's annunciation system being specialized to only one type of application.

A still more complex system would allow the user to record arbitrary annunciations of essentially any duration and complexity. Provision could be made for the user to associate such annunciations with specific channel numbers, either on the basis of one annunciation per channel or, like the previous systems, they too could be linked together under user control to form more complex annunciations unique to each channel. This system offers the user the greatest flexibility in terms of conveying meaningful information about the channel but places the greatest demand on circuit complexity and sophistication.

Finally, there is the problem, in any implementation in which the user has any degree of control over the content of the annunciations, of changing annunciations when an large number of channels is involved. To avoid the tedium, and possible errors, associated with setting and resetting perhaps hundreds of channel annunciations at a time, provision can be made for recording and uploading or downloading whole sets of annunciations. For example, after the receiver has been set up for annunciations appropriate for a first application, and prior to set up for a second application, the user could download the entire first set of annunciations to an external storage medium. Likewise, the second set of annunciations could also be downloaded to external storage. Thereafter, any such previously downloaded set could be uploaded back into the receiver using means provided for that purpose, thereby resetting the entire annunciation set in a very short time and assuring also that no errors have been introduced inadvertently.

Quite obviously, this method extends also to the reproduction and distribution of annunciation sets prepared in advance by other agencies, or created and shared among users or user groups. A typical example is again provided by the case of sports car racing. Specific channel frequencies are assigned to race participants prior to a race in an effort to guarantee interference-free communications among participants. These assignments are published in advance and made available to spectators and the public. With the introduction of the current invention, these frequency assignments, in association with appropriate annunciations, could also be distributed in prerecorded form, using the appropriate media, for immediate uploading by users into their scanning receivers, thereby eliminating the time consuming and error prone task of manual setup.

Means of incorporating all, or any combination, of the above into the annunciation function 14 of the invention will be obvious to those skilled in the art. For example, means for recording user-defined primitives or complex annunciations can be implemented using well known analog or digital techniques. Association of primitives or complex annunciations both with channels and with each other to form more complex annunciations can be accomplished using, for example, keypad entry and standard discrete logic elements or, if a microprocessor is used, a keypad and a stored program. Likewise, the uploading and downloading functions can be implemented using a wide variety of media and techniques well known in the art. Furthermore, other strategies for determining the annunciations, associating them with channels, and uploading them to and downloading them from the receiver using well known methods will also be obvious to those skilled in the art. For this reason, and because the number of possible ways of combining these elements in a given application is very large, none have been specifically illustrated here. All such means and strategies are considered to fall within the scope of the current invention.

Other modifications and refinements will be obvious to those skilled in the art. For example, provision may be made for special handling of annunciations in the event of a rapid series of closely spaced transmissions of short duration within different channels. In such a case, sequences of annunciations and, if appropriate, concurrent transmissions may be stacked for delayed playback. Or, in the event of a rapid series of closely spaced transmissions of short duration all of which are in the same channel, provision may be made for only one annunciation on the first such transmission since the subsequent annunciations would be redundant. This latter refinement makes sense, of course, only in implementations of the invention in which annunciations are made at the beginning of transmissions. Likewise, various provisions may be made for handling the relationship between scanner delay time, which, if available, can usually be enabled on a channel-by-channel basis, and annunciations generated by the current invention. For example, the scanner delay time appended to the end of a transmission in a channel may be treated simply as an extension of the duration of the transmission for the purposes of determining when the annunciation is to begin. Or, the annunciation may be set to begin some fixed or selectable absolute or fractional time following the beginning of the appended delay or preceding the anticipated end of the delay. All such modifications and refinements can be realized using techniques and methods well known in the art and are considered to fall within the scope of the current invention.

Accordingly, we claim:

1. A scanning receiver channel identification apparatus comprising:
   a) a scanning receiver,
   b) means for generating annunciations to be associated with the channels to which said scanning receiver is tuned,
   c) means for associating said annunciations with said channels to which said scanning receiver is tuned,
   d) means for incorporating said annunciations into the detected output of said scanning receiver, and
   e) means for selecting said annunciations from a predefined set created or supplied by the user and maintained by said scanning receiver.

2. The scanning receiver channel identification apparatus of claim 1 wherein said annunciations can be linked into varied sequences to form more complex annunciations.

3. The scanning receiver channel identification apparatus of claim 1 wherein said sets of annunciations maintained by said scanning receiver can be uploaded to and downloaded from said scanning receiver.

4. A method for providing scanning receiver channel identification comprising:
   a) a scanning receiver,
   b) generating annunciations to be associated with the channels to which said scanning receiver is tuned,
   c) associating said annunciations with said channels to which said scanning receiver is tuned,
   d) incorporating said annunciations into the detected output of said scanning receiver, and
   e) selecting said annunciations from a predefined set created or supplied by the user and maintained by said scanning receiver.

5. The method for providing scanning receiver channel identification of claim 4 wherein said annunciations can be linked into varied sequences to form more complex annunciations.

6. The method for providing scanning receiver channel identification of claim 4 wherein said sets of annunciations maintained by said scanning receiver can be uploaded to and downloaded from said scanning receiver.

* * * * *